US008482367B2

(12) United States Patent
Weiss

(10) Patent No.: US 8,482,367 B2
(45) Date of Patent: Jul. 9, 2013

(54) STRIPLINE HAVING PLATED THROUGH-CONTACTS

(75) Inventor: Frank Weiss, Bernsdorf (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 376 days.

(21) Appl. No.: 13/001,179

(22) PCT Filed: Jul. 8, 2009

(86) PCT No.: PCT/EP2009/004950

§ 371 (c)(1),
(2), (4) Date: Jan. 31, 2011

(87) PCT Pub. No.: WO2010/003665

PCT Pub. Date: Jan. 14, 2010

(65) Prior Publication Data

US 2011/0128099 A1 Jun. 2, 2011

(30) Foreign Application Priority Data

Jul. 9, 2008 (DE) .................... 20 2008 009 225 U

(51) Int. Cl.
*H03H 7/00* (2006.01)
*H01P 1/22* (2006.01)

(52) U.S. Cl.
USPC ........................................ 333/238; 333/81 A

(58) Field of Classification Search
USPC .................... 333/81 A, 81 R, 22 R, 238, 204, 333/222, 243
See application file for complete search history.

(56) References Cited

U.S. PATENT DOCUMENTS

| | | | | |
|---|---|---|---|---|
| 4,272,739 | A * | 6/1981 | Nesses | 333/81 A |
| 4,521,755 | A | 6/1985 | Carlson et al. | |
| 5,039,961 | A * | 8/1991 | Veteran | 333/81 A |
| 7,839,238 | B2 * | 11/2010 | Le Nadan | 333/185 |
| 2004/0227232 | A1 | 11/2004 | Fournier et al. | |

FOREIGN PATENT DOCUMENTS

| | | |
|---|---|---|
| GB | 2322237 | 8/1998 |

OTHER PUBLICATIONS

Wolfgang Menzel, et al., "Miniaturized Suspended Stripline Filters for Integration into Extended Circuits", Microwave Conference, 2006. 36th European, IEEE, PI, Sep. 1, 2006, pp. 909-912, XP031005718.

E. Yamashita, et al., "Effects of Side-Wall Groves on Transmission Characteristics of Suspended Striplines", IEEE Transactions on Microwave Theory and Techniques, Dec. 1985, pp. 1323-1328, vol. 33, No. 12, XP001370096.

George E. Ponchak et al., "The Use of Metal Filled Via Holes for Improving Isolation in LTCC RF and Wireless Multichip Packages", IEEE Transactions on Advanced Packaging, vol. 23, No. 1, Feb. 2000, pp. 88-99, XP011002223.

(Continued)

*Primary Examiner* — Stephen Jones
(74) *Attorney, Agent, or Firm* — DeLio & Peterson, LLC; Robert Curcio

(57) ABSTRACT

The invention relates to a stripeline for high-frequency signals, having a signal conductor and at least one earth conductor, both being disposed on a substrate made from an electrically insulating material. According to the invention at least one hole is made in the substrate, wherein said hole is at least partially filled with an electrically conducting material, wherein an electrically conducting connection is made from at least one earth conductor to the electrically conducting material.

25 Claims, 1 Drawing Sheet

OTHER PUBLICATIONS

George E. Ponchak et al., "Experimental Verification of the Use of Metal Filled Via Hole Fences for Crosstalk Control of Microstrip Lines in LTCC Packages", IEEE Transactions on Advanced Packaging, vol. 24, No. 1, Feb. 2001, pp. 76-80, XP011002322.

Xilang Zhou; Ji Yao; Xinbao Gong; "Quasistatic Analysis of a New CCPW With Cylindrical Shielding" Microwave and Optical Technology Letters, vol. 34, No. 3, Aug. 5, 2001, pp. 213-215.

* cited by examiner

STRIPLINE HAVING PLATED THROUGH-CONTACTS

BACKGROUND OF THE INVENTION

1. Field of the Invention

The present invention relates to a stripline for radio-frequency signals, having a signal conductor and at least one earth conductor, both being arranged on a substrate made from an electrically insulating material. The invention also relates to an attenuator as well as a terminating resistor.

2. Description of Related Art

What are used in high-precision attenuators and terminating resistors, for calibrating network vector analyzers for example, are striplines, and in particular what are referred to as "suspended striplines". When the striplines are being sized, parameters which act in opposite directions have to be optimized in this case. On the one hand, the stripline and the substrate on which the stripline is formed have to be designed to be as geometrically small as possible, because at frequencies whose wavelengths are equal to or smaller than the geometrical dimensions of the structure, and in particular than the geometrical dimensions of the substrate, waveguide modes which produce undesirable electrical properties from the point of view of impedance matching are excited. On the other hand, the geometrical dimensions of the substrate set a corresponding limit to the maximum thermal load which the structure comprising the stripline and substrate is able to accept, which means that only a limited electrical power is able to be transmitted through the attenuator and the terminating resistor. At higher powers the entire structure would be thermally damaged or destroyed. Larger geometrical dimensions, of the substrate for example, would be desirable for higher powers, but these would at once result in a fall in the limiting frequency up to which the structure could be operated while still exhibiting the desired electrical properties.

SUMMARY OF THE INVENTION

Bearing in mind the problems and deficiencies of the prior art, it is therefore an object of the present invention to provide a stripline, an attenuator, and a terminating resistor to the effect that a high electrical power can be transmitted at a limiting frequency which is, at the same time, high.

This object is achieved in accordance with the invention by a stripline of the above-mentioned kind, by an attenuator of the above-mentioned kind, and by a terminating resistor of the above-mentioned kind.

Still other objects and advantages of the invention will in part be obvious and will in part be apparent from the specification.

The above and other objects, which will be apparent to those skilled in the art, are achieved in the present invention which is directed to a stripline for radio-frequency signals, including: a signal conductor and at least one earth conductor, both being arranged on a substrate made from an electrically insulating material; at least one hole being made in the substrate, the hole at least partially filled with an electrically conducting material; an electrically conducting connection being made from the at least one earth conductor to the electrically conducting material; and the stripline being co-planar and having the signal conductor arranged between two earth conductors, with holes which are spaced apart from one another being made along both earth conductors for the entire length thereof, the substrate provided with the co-planar stripline being arranged in a tubular outer-conductor member made from an electrically conducting material in such a way that the earth conductors are electrically connected to the outer-conductor member and the signal conductor is arranged at least approximately co-axially to the tubular outer-conductor member.

The stripline may include a plurality of holes, spaced apart from one another, made in the longitudinal direction of the stripline along at least one earth conductor. Each hole may be completely filled with the electrically conducting material. The holes may be in the form of a through-hole which passes entirely through the substrate. The holes may be parallel with one another.

Radial grooves may also be included in which they are situated opposite one another, and where they are formed in an inner wall of the outer-conductor member.

In a second aspect, the present invention is directed to a power attenuator for an RF signal line.

In a third aspect, the present invention is directed to a terminating resistor for an RF signal.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
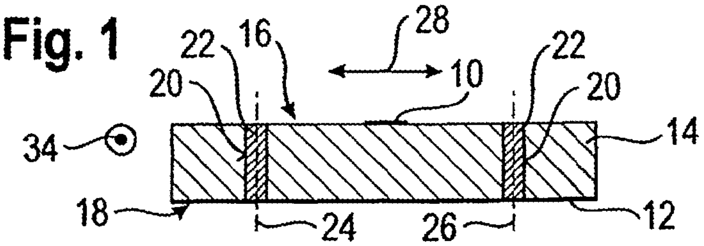
FIG. 1 is a view in section of a first preferred embodiment of stripline according to the invention.

In describing the preferred embodiment of the present invention, reference will be made herein to FIGS. 1-4 of the drawings in which like numerals refer to like features of the invention.

In a stripline of the above-mentioned kind, provision is made in accordance with the invention for at least one hole to be made in the substrate, which hole is at least partially filled with an electrically conducting material, an electrically conducting connection being made from at least one earth conductor to the electrically conducting material.

This has the advantage that waveguide modes of the entire structure forming the stripline are shifted to higher frequencies, thus enabling substrates which are geometrically large and which still have good electrical properties with regard to impedance matching and reflection factors and attenuation to be used to transmit high RF powers even at frequencies at which the wavelength is equal to or appreciably smaller than the geometrical dimensions of the substrate. In accordance with the invention, power attenuators or terminating resistors for high dissipated powers are made available which have, at the same time, a high upper limiting frequency with respect to predetermined attenuation of the RF signals transmitted, which means that interference modes are suppressed even at high frequencies.

In a preferred embodiment, a plurality of holes, spaced apart from one another, are made in the longitudinal direction of the stripline along at least one earth conductor, and in particular along at least two earth conductors on either side of the signal conductor.

Particularly good electrical effectiveness with regard to the shifting of waveguide modes to higher frequencies is achieved by completely filling the hole with the electrically conducting material.

The hole preferably takes the form of a through-hole with passes entirely through the substrate. Two or more holes are usefully made in parallel with one another.

In a preferred embodiment, three or more holes are made along at least one earth conductor at an even spacing from one another.

In an embodiment which is a particular preference, the stripline takes the form of a co-planar stripline. In this case the co-planar stripline has for example a signal conductor which is arranged between two earth conductors, with holes which are spaced apart from one another being made along both earth conductors for the entire length thereof.

A suspending stripline is obtained by arranging the substrate provided with the co-planar stripline in a tubular outer-conductor member made from an electrically conducting material in such a way that the earth conductors are electrically connected to the outer-conductor member and the signal conductor is arranged at least approximately co-axially to the tubular outer-conductor member.

To hold the substrate in place within the outer-conductor member, radial grooves situated opposite one another, in which the substrate engages, are usefully formed in an inner wall of the outer-conductor member.

In an alternative embodiment of the invention which is a particular preference, the stripline has a signal conductor on one side of the substrate and an earth conductor on the opposite side of the substrate. In this case the earth conductor takes the form of, for example, a planar coating of the substrate, which in particular covers the full area thereof, with an electrically conducting material.

In an embodiment of the invention which is a particular preference, the stripline is arranged on one side of the substrate and formed on a side of the substrate opposite therefrom is a planar coating of the substrate, which in particular covers the full area thereof, with an electrically conducting material, the material having in addition an electrically conducting connection to the coating in at least one hole.

A plurality of bores are usefully arranged in at least two planes which are spaced away from one another with, on either side of the signal conductor, at least one plane intersecting the substrate on either side at a distance from the signal conductor. The electrically effective width of the substrate is limited to a region between the two planes, whereas the entire substrate remains effective for the dissipation of thermal energy.

The preferred embodiment of stripline according to the invention for radio-frequency signals which is shown in FIG. 1 comprises a signal conductor 10 and an earth conductor 12, both of which are arranged on a substrate 14 made from an electrically insulating material. The signal conductor 10 is arranged on a first side 16 of the substrate 14 in this case and the earth conductor 12 is arranged on an opposite, second side 18 of the substrate 14. The earth conductor 12 takes the form on the second side 18 of the substrate 14 of planar metalizing. In accordance with the invention, through-holes 20 are made in the substrate 14 and are completely filled with an electrically conducting material 22 which is electrically connected to the earth conductor 12. A row of holes 20 which are spaced apart from one another is made on each of the two sides of the signal conductor 10, thus causing, looking in the longitudinal direction of the stripline, a predetermined length of the signal conductor 10 to be enclosed by the holes 20 on the two sides. The holes 20 on each side are situated in respective planes 24, 26 in space, with the two planes 24, 26 intersecting the substrate 14 on opposite sides of the signal conductor 10. In the embodiment shown, the planes 24, 26 are aligned parallel to a longitudinal axis of the signal conductor 10 and perpendicular to the parallel sides 16, 18 of the substrate 14.

The filled holes 20 limit an electrically effective width of the substrate 14 to the region between the planes 24, 26, which means that it is only in this region that waveguide modes can be excited. Hence the waveguide modes are shifted to higher frequencies. However, at the same time those portions of the substrate 14 which project beyond the planes 24, 26 containing the filled holes 20 maintain their thermal properties and these portions thus help to dissipate thermal energy. In this way, the stripline is able to dissipate a great deal of thermal energy, in line with the large size of the substrate 14 in the lateral direction 28, without unwanted waveguide modes arising which equate with the overall width of the substrate 14 in the lateral direction.

Figure 2:
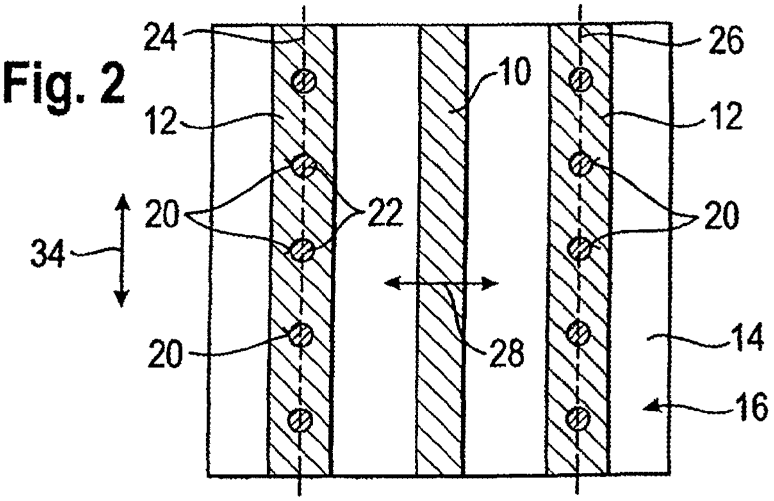
FIG. 2 is a plan view of a second preferred embodiment of stripline according to the invention.

FIG. 2 shows a second preferred embodiment of stripline according to the invention in the form of a co-planar line in which a signal conductor 10 is arranged between two earth conductors 12. The signal conductor 10 and earth conductors 12 are arranged on the first side 16 of the substrate 14 and thus in a common plane which is defined by the first side 16. The two planes 24 and 26 containing the holes 20 are arranged on either side of the signal conductor 10 and each extend parallel to a longitudinal axis of the earth conductors and in the centers of the earth conductors 12 and perpendicularly to the plane defined by the first side 16.

Figure 3:
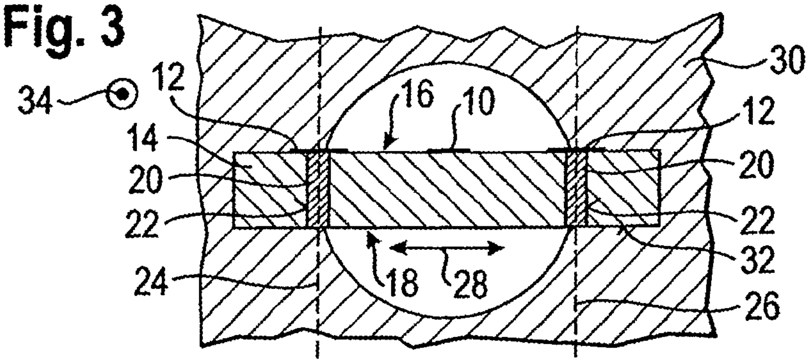
FIG. 3 is a view in section of a third preferred embodiment of stripline according to the invention.

FIG. 3 shows a third preferred embodiment of stripline according to the invention in the form of a suspended stripline. This suspended stripline has a co-planar line as shown in FIG. 2 and a cylindrical outer-conductor member 30, the substrate 14 being held in place in internal radial recesses 32 in the outer-conductor member 30 in such a way that the signal conductor 10 extends approximately co-axially to the outer-conductor member 30. The outer-conductor member 30 is made from an electrically conducting material and is electrically connected to the earth conductors 12. The rows of filled holes 20 which are arranged on either side of the signal conductor 10 in the planes 24, 26 form a sort of grid which limits the electrically effective extent of the substrate 14 in the lateral direction 28. However, those portions of the substrate 14 which extend beyond the planes 24, 26 in the lateral direction 28 remain thermally effective, and high electrical powers can thus be transmitted by this stripline shown in FIG. 3, even to a point close to its limiting frequency, which may for example be such as 15 GHz to 30 GHz and in particular 18 GHz or 26.5 GHz.

Figure 4:
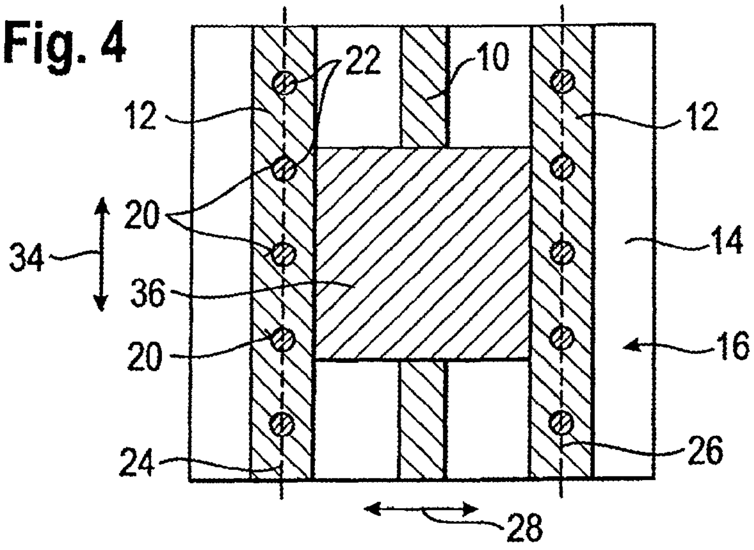
FIG. 4 shows a preferred embodiment of attenuator according to the invention which has a stripline as shown in FIG. 3.

FIG. 4 shows an attenuator which has a stripline according to the invention as shown in FIG. 2. In this case, the signal conductor 10 is replaced, for a predetermined length of the stripline in the longitudinal direction 34, by an electrical resistive structure 36 which is connected electrically to the signal conductor 10 and the earth conductors 12 on the two sides. Energy is dissipated by means of this resistive structure 36 and the signal travelling via the stripline is attenuated in respect of its signal strength. A typical attenuation constant is for example 20 dB or 30 dB. When the attenuation levels are high and are for example 30 or 40 dB, this attenuator can be used as a terminating resistor. In this terminating resistor, power is dissipated in stages by the resistive structure 36. This arrangement is used for example as a calibration standard in load form.

In all the embodiments described above, the exciting of waveguide modes is prevented across the entire cross-section of the substrate 14 by holes 20, forming a grid, in the planes 24, 26. The filled holes 20 are situated in the region of the earth conductors 12. In the longitudinal direction 34, the filled holes 20 are arranged along the earth conductors 12 at an even spacing from one another.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A stripline for radio-frequency signals, including:

a signal conductor and at least one earth conductor, both being arranged on a substrate made from an electrically insulating material;

at least one hole being made in the substrate, said hole at least partially filled with an electrically conducting material;

an electrically conducting connection being made from said at least one earth conductor to the electrically conducting material; and said stripline being co-planar and having said signal conductor arranged between two earth conductors, with holes which are spaced apart from one another being made along both earth conductors for the entire length thereof, the substrate provided with the co-planar stripline being arranged in a tubular outer-conductor member made from an electrically conducting material in such a way that the earth conductors are electrically connected to the outer-conductor member and the signal conductor is arranged at least approximately co-axially to the tubular outer-conductor member.

2. The stripline of claim 1 including a plurality of bores arranged in at least two planes which are spaced away from one another with, on either side of the signal conductor, at least one plane intersecting the substrate on either side at a distance from the signal conductor.

3. A power attenuator for an RF signal line comprising a stripline which is formed in accordance with claim 1.

4. A terminating resistor for an RF signal line including a stripline which is formed in accordance with claim 1.

5. The stripline of claim 1 including a plurality of holes, spaced apart from one another, made in the longitudinal direction of the stripline along at least one earth conductor.

6. The stripline of claim 5 including having said plurality of holes completely filled with the electrically conducting material.

7. The stripline of claim 5 including having said holes take the form of through-holes with passes entirely through the substrate.

8. The stripline of claim 1 including having said hole completely filled with the electrically conducting material.

9. The stripline of claim 8 including having said hole take the form of a through-hole with passes entirely through the substrate.

10. The stripline of claim 8 including three or more holes made along at least one earth conductor at an even spacing from one another.

11. The stripline of claim 1 including having said at least one hole take the form of a through-hole which passes entirely through the substrate.

12. The stripline of claim 11 wherein two or more holes are made in parallel with one another.

13. The stripline of claim 11 including three or more holes made along at least one earth conductor at an even spacing from one another.

14. The stripline of claim 11 including radial grooves situated opposite one another, in which the substrate engages, formed in an inner wall of the outer-conductor member.

15. A power attenuator for an RF signal line comprising a stripline which is formed in accordance with claim 11.

16. The stripline of claim 1 wherein two or more holes are made in parallel with one another.

17. The stripline of claim 16 including three or more holes made along at least one earth conductor at an even spacing from one another.

18. The stripline of claim 16 including a plurality of bores arranged in at least two planes which are spaced away from one another with, on either side of the signal conductor, at least one plane intersecting the substrate on either side at a distance from the signal conductor.

19. The stripline of claim 1 including three or more holes made along at least one earth conductor at an even spacing from one another.

20. The stripline of claim 19 including radial grooves situated opposite one another, in which the substrate engages, formed in an inner wall of the outer-conductor member.

21. The stripline of claim 19 including a plurality of bores arranged in at least two planes which are spaced away from one another with, on either side of the signal conductor, at least one plane intersecting the substrate on either side at a distance from the signal conductor.

22. The stripline of claim 1 including radial grooves situated opposite one another, in which the substrate engages, formed in an inner wall of the outer-conductor member.

23. The stripline of claim 22 including a plurality of bores arranged in at least two planes which are spaced away from one another with, on either side of the signal conductor, at least one plane intersecting the substrate on either side at a distance from the signal conductor.

24. A power attenuator for an RF signal line comprising a stripline which is formed in accordance with claim 22.

25. A terminating resistor for an RF signal line including a stripline which is formed in accordance with claim 22.

* * * * *